(12) United States Patent
Kodimer

(10) Patent No.: US 7,307,855 B2
(45) Date of Patent: Dec. 11, 2007

(54) ENCLOSURE FOR PRINTED WIRING BOARD ASSEMBLIES

(75) Inventor: Dennis A. Kodimer, Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 279 days.

(21) Appl. No.: 10/958,217

(22) Filed: Oct. 5, 2004

(65) Prior Publication Data
US 2006/0072294 A1   Apr. 6, 2006

(51) Int. Cl.
H05K 7/14 (2006.01)
(52) U.S. Cl. ............... 361/797; 361/730; 361/748
(58) Field of Classification Search .......... 361/728, 361/730, 748, 752, 760, 807
See application file for complete search history.

(56) References Cited
U.S. PATENT DOCUMENTS 4,840,286 A * 6/1989 Heberling et al. ......... 220/4.02
4,866,215 A * 9/1989 Muller et al. .............. 174/50
5,315,486 A * 5/1994 Fillion et al. .............. 361/795
5,838,548 A * 11/1998 Matz et al. ................ 361/784

\* cited by examiner

Primary Examiner—Dean A. Reichard
Assistant Examiner—Yuriy Semenenko
(74) Attorney, Agent, or Firm—Ohlandt, Greeley, Ruggiero & Perle, LLP

(57) ABSTRACT

There is provided an enclosure for printed wiring assemblies (PWAs). The enclosure includes first and second enclosure halves disposed on opposite sides of the PWA. The first and second enclosure halves are substantially identical in size, shape and location of fastening features. The first and second halves are offset along an axis of the PWA to define an enclosed region and an exposed region of the PWA. The enclosed region protects PWA-mounted components from environmental factors while the exposed region allows access to PWA-mounted components that are accessed during installation and operation of the assembly.

15 Claims, 4 Drawing Sheets

ENCLOSURE FOR PRINTED WIRING BOARD ASSEMBLIES

BACKGROUND OF THE INVENTION

1. Field of the Invention

The present invention relates to enclosures for electronic devices, and more particularly, to enclosures for printed wiring board assemblies.

2. Description of the Related Art

Printed wiring assemblies (PWAs) play an important role in electronics and serve as building blocks for larger electronic systems. PWAs generally include of a number of electronic components mounted on a printed wiring board (PWB).

It is important to be able to incorporate PWAs into electronic systems simply, inexpensively, and in a manner so that the PWA is properly protected from environmental, electrostatic and electromagnetic influences.

There is a need to provide an enclosure for printed wiring assemblies, for providing environmental and electromagnetic protection and containment, that can be manufactured and assembled simply and with low cost.

There is also a need to provide such an enclosure that can be used and reused with a variety of printed wiring assemblies.

There is further a need to provide such an enclosure that allows for ease of access to electronic connectors.

SUMMARY OF THE INVENTION

These and other needs of the present invention are achieved by an enclosure for a printed wiring assembly (PWA) that includes two components, preferably two substantially identical enclosure halves.

An enclosure embodiment of the present invention includes a first component disposed on a first side of a printed wiring assembly (PWA), and a second component disposed on a second side of the PWA. The first component is offset from the second component, and at least a portion of the PWA is exposed to the atmosphere.

In another embodiment of the present invention, the first component and the second component are substantially identical in shape and size.

In another embodiment of the present invention, the PWA includes a printed wiring board.

In another embodiment of the present invention, the first component is offset from the second component along a plane defined by a surface of the PWA.

In another embodiment of the present invention, the first component and the second component define an enclosed region and an exposed region of the PWA.

In another embodiment of the present invention, at least one electronic component is disposed in the enclosed region of the PWA.

In another embodiment of the present invention, at least one connector is disposed in the exposed region of the PWA.

In another embodiment of the present invention, the enclosed region is hermetically sealed.

In another embodiment of the present invention, the first component and the second component are constructed from at least one material selected from a metal, a conductively coated plastic, or a combination.

In another embodiment of the present invention, the enclosure is symmetrical about an axis that is centrally located on the printed wiring board and in the plane defined by the printed wiring board.

In another embodiment of the present invention, the first component and the second component are electrically connected to the PWA.

In another embodiment of the present invention, the enclosure also includes a connection arrangement that fastens the first component and the second component to the PWA.

In another embodiment of the present invention, the connection arrangement includes a first set of holes on the first component and a second set of holes on the second component. The first set of holes of the first component is mated with the second set of holes of the second component. The connection arrangement also includes a number of tensional fasteners to maintain the first component and the second component in a fixed offset position relative to the PWA, and to maintain the enclosure as an integral whole.

In another embodiment of the present invention, the connection arrangement further includes a second set of holes on the first component and a first set of holes on the second component. The second set of holes of the first component is mated with the first set of holes of the second component.

In another embodiment of the present invention, the connection arrangement includes a first set of holes and a first set of female studs on the first component and a second set of holes and a second set of female studs on the second component. The connection arrangement also includes a number of tensional fasteners to maintain the first component and the second component in a fixed offset position relative to the PWA, and to maintain the enclosure as an integral whole. The first set of holes is mated with the second set of female studs, and the second set of holes is mated with the first set of female studs.

In another embodiment of the present invention, the tensional fasteners include rivets, screws, nuts and bolts, a chemical adhesive, and/or a mechanical fastener.

In another embodiment of the present invention, the connection arrangement includes tension inducing devices that hold the first component and the second component in a fixed offset position relative to the PWA, while maintaining the enclosure as an integral whole.

In another embodiment of the present invention, the connector arrangement further includes a first and second set of holes through the PWA for connecting the first component and the second component to the PWA.

A method embodiment of the present invention includes the steps of disposing the first component on a first side of the PWA and disposing the second component on a second side of the PWA, so that the first component is offset from the second component. At least a portion of the PWA is exposed to the atmosphere.

In another embodiment of the method of the present invention, the first component and the second component are substantially identical in shape and size.

In another embodiment of the method of the present invention, the first component is offset from the second component along a plane defined by a surface of the PWA.

The offset positioning of the enclosure halves allows connectors to be located on the PWA without the need to specifically design enclosure components and without the need to design connector or component dependent openings in the enclosure. This makes a single enclosure design viable for multiple connector or component layouts without the need to redesign the enclosure. Thus, the enclosure design is simple and reusable while accommodating multiple layouts of connectors and other PWA components that are exposed outside the enclosure. Another advantage of this arrangement is that exposed connectors or components can be accommodated on either end of the PWA. A method for assembling the enclosure is also described.

BRIEF DESCRIPTION OF THE DRAWINGS

The present invention is further described in reference to the following drawings. Like components in different drawing Figures are represented by like reference numbers.

DESCRIPTION OF THE INVENTION

Figure 1:
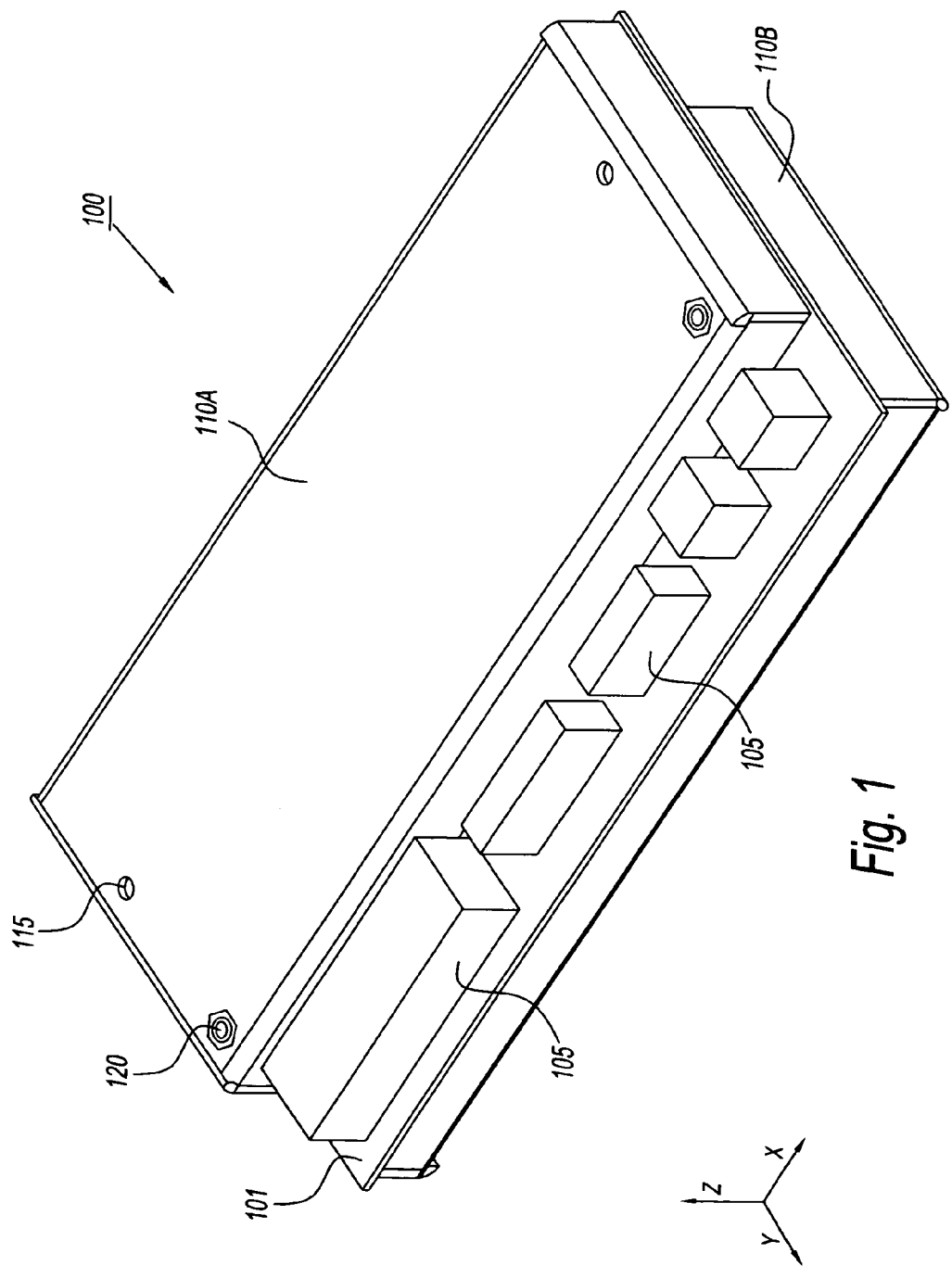
FIG. 1 shows an enclosure assembly according to the present invention.

An embodiment of the present invention, an enclosure assembly 100, is illustrated in FIG. 1. Enclosure assembly 100 includes a printed wiring assembly (PWA) 101 that includes one or more electronic components (not shown) and one or more connectors 105. PWA 101 is sandwiched between a first component, hereinafter enclosure half 110A, and a second component, hereinafter enclosure half 110B. Enclosure halves 110A and 110B are disposed on opposite sides of PWA 101, and act to protect the electronic components of PWA 101 from environmental and electrical influences.

Enclosure halves 110A and 110B are preferably, but not necessarily, rectangular in shape, each having substantially the same length, width and depth. Enclosure halves 110A and 110B are preferably composed of an electrically conductive material, including metals, such as aluminum, and conductively coated plastics.

Enclosure halves 110A and 110B are preferably substantially identical and interchangeable. Enclosure halves 110A and 110B are substantially identical in size, shape and location of fastening features. Enclosure half 110A can be connected to either the upper or lower surface of PWA 101, as can enclosure half 110B.

Both enclosure halves 110A and 110B feature a connection arrangement to allow enclosure halves 110A and 110B to be secured to one PWA 101 and to one another. The connection arrangement may include tension inducing devices that maintain enclosure halves 110A and 110B in a fixed offset position relative to PWA 101, while maintaining enclosure assembly 100 as an integral whole. Examples of tension inducing devices include clamps and spring clips.

Other examples of connection arrangements include a number of sets of holes or other features for securing enclosure halves 110A and 110B. Referring again to FIG. 1, both enclosure halves 110A and 110B are fitted with holes 115 and female studs 120. In this embodiment, ordinary tensional fasteners such as rivets, and nuts and screws are used to hold enclosure assembly 100 together.

Figure 2:
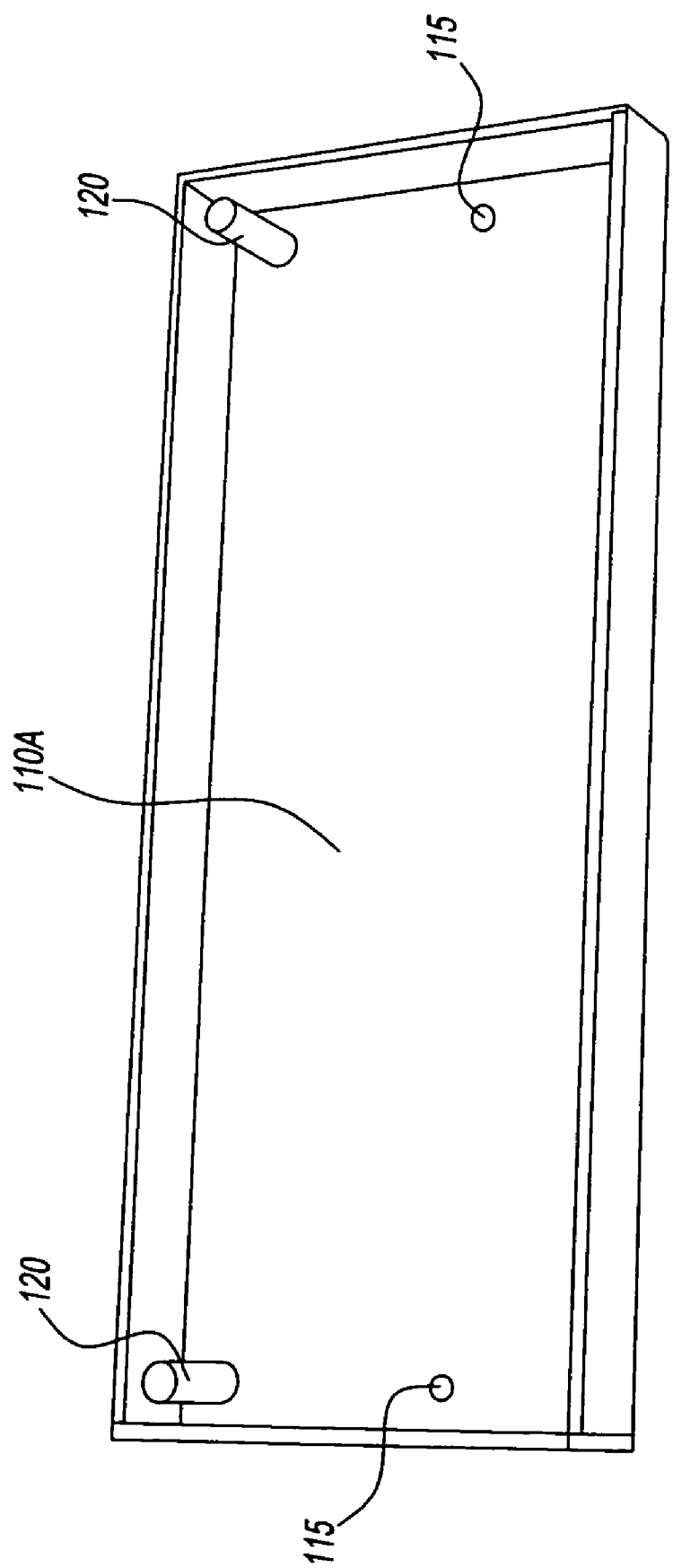
FIG. 2 shows an underside view of one of the two enclosure halves.
Figure 3:
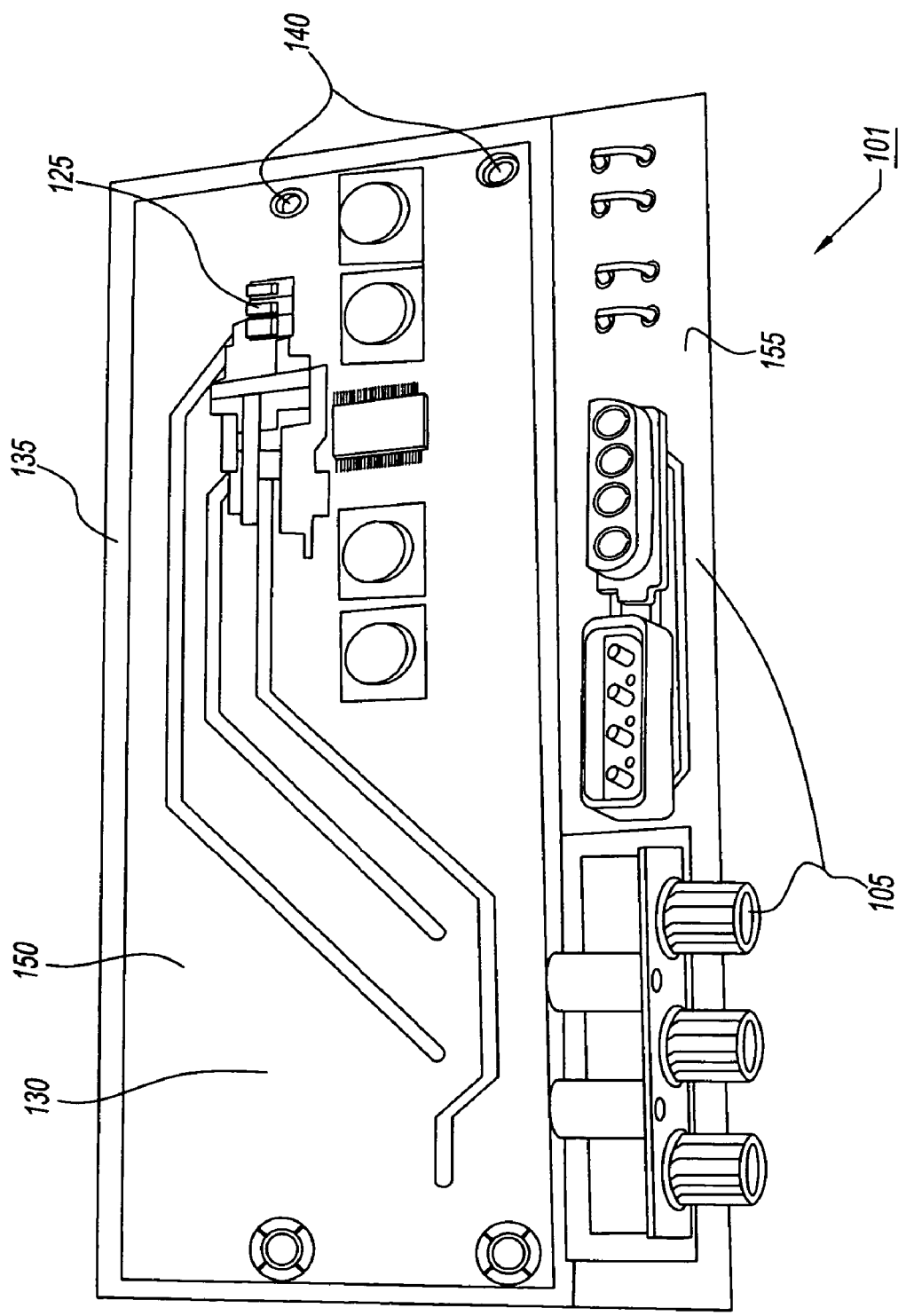
FIG. 3 shows a top view of a printed wiring assembly.

Referring also to FIGS. 2 and 3, upon assembly, enclosure halves 110A and 110B are connected via screws or other fasteners inserted through holes 115 and into female studs 120. PWA 101 also includes holes 140 through which screws are inserted to secure enclosure halves 110A and 110B to PWA 101. Enclosure halves 10A and 110B are positioned to mate holes 115 of enclosure half 110A with female studs 120 of enclosure half 110B. As a result, holes 115 of enclosure half 110A line up over a position on PWA 101 that is identical to the position under which female studs 120 of enclosure half 110B are located. Likewise, female studs 120 of enclosure half 110A are mated with holes 115 of enclosure half 110B, so that female studs 120 of enclosure half 110A line up over a position on PWA 101 that is identical to the position under which holes 115 of enclosure half 110B are located.

Still referring to FIG. 1, enclosure halves 110A and 110B are positioned in an offset manner. Enclosure half 110A protects electronic components 125 on PWA 101 while leaving connectors 105 exposed for easy connection to other electronic components. Enclosure half 110B acts to protect any components on the underside of PWA 101 and provides support and stability to the PWA 101 and to enclosure assembly 100 in general.

Referring to FIG. 3, PWA 101 and its components are demonstrated. PWA 101 includes a printed wiring board (PWB) 130. Various electronic components 125 are shown on a side of PWB 130. Electronic components 125 include both printed circuitry and attached components. Connectors 105 are mounted directly on PWB 130 and are electrically connected to electronic components 125. Grounding circuitry 135 contacts the edge of enclosure half 110A to provide electromagnetic suppression. Holes 140 in PWB 130 allow enclosure halves 110A and 110B to be secured to PWA 101, and also to be electrically in contact with one another and with PWA 101.

Referring again to FIG. 3, enclosure halves 110A and 110B define distinct regions on PWA 101. An enclosed region, which is completely covered by either enclosure half 110A or 110B, may carry electronic components 125. A region 150 represents a portion of the enclosed region of PWA 101, upon placement of enclosure half 110A or 110B. The enclosed region can be hermetically sealed to protect electronic components 125 from environmental influences such as dust. The enclosed region is also protected from electrical influences such as electromagnetic interference and electrostatic discharge (ESD).

Another distinct region of PWA 101 is an exposed region, which encompasses those areas of PWA 101 that are not enclosed by either enclosure half 110A or 110B. A region 155 represents a portion of the exposed region of PWA 101, upon placement of enclosure half 110A or 110B. Connectors 105 can be attached to PWA 101 in the exposed region and electrically connected to electronic components 125 in the enclosed region. In the embodiment shown in FIG. 1, only a first portion of the exposed region contains connectors. A second portion of the exposed region of PWA 101 is left blank in this embodiment, but may be fitted with additional connectors.

In an alternative embodiment, the surfaces on the exposed region of PWA 101, including region 155 shown in FIG. 3, may further include a continuous conductive layer. By this design, electromagnetic shielding is made continuous around the whole of PWA 101, while allowing access to connector and component wires in the enclosed region of PWA 101 using mounting holes associated with connectors 105 and other components.

Figure 4A:
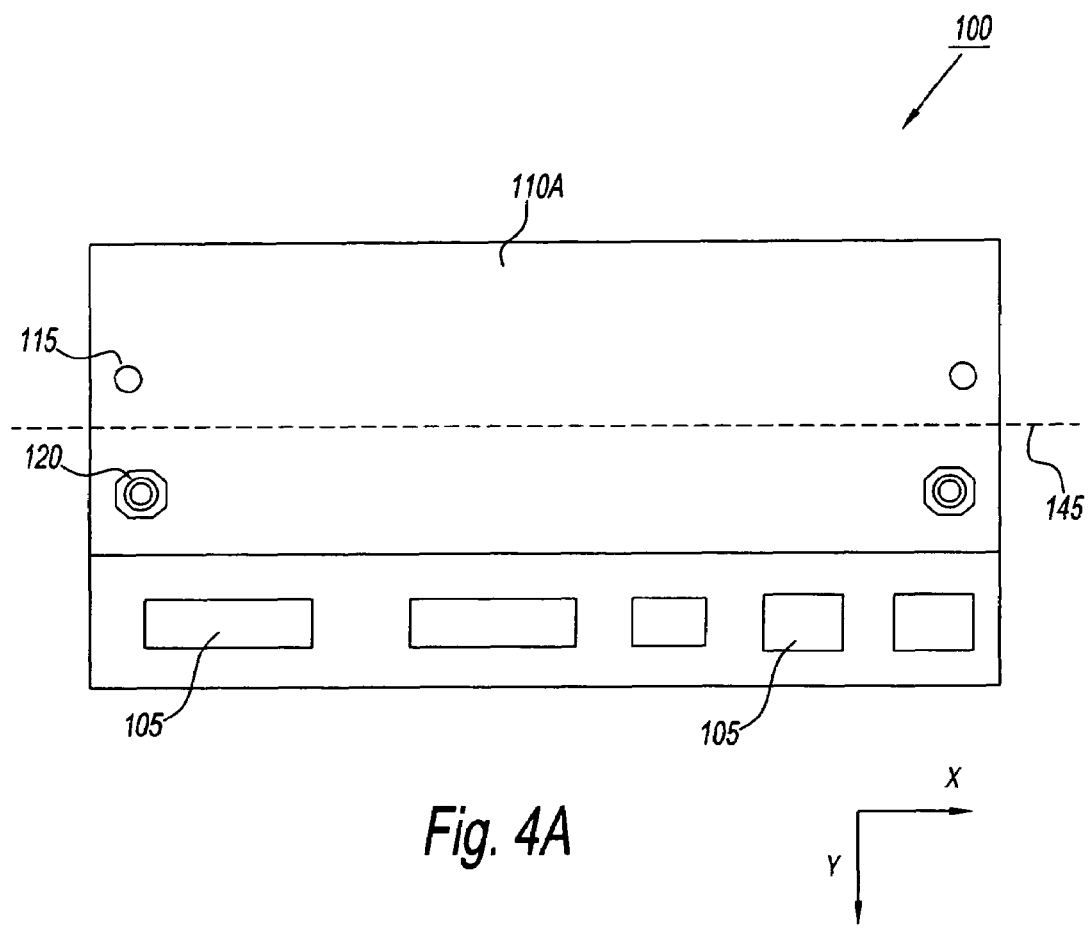
FIG. 4A shows a top view of the enclosure assembly of FIG. 1.
Figure 4B:
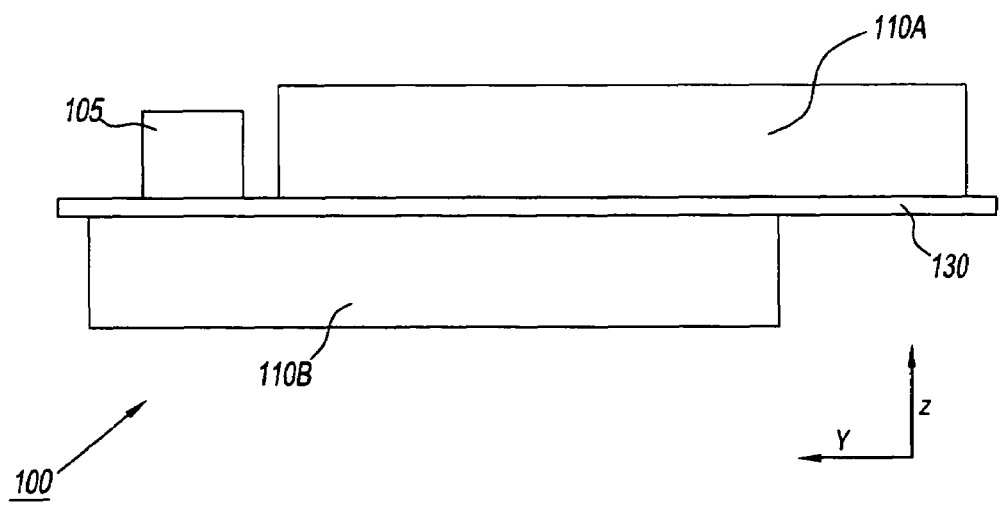
FIG. 4B shows a side view of the enclosure assembly of FIG. 1.

FIGS. 4A and 4B illustrate the offset and preferably symmetrical positioning of enclosure halves 110A and 110B on PWA 101. Axes x, y, and z are defined in FIG. 1. FIG. 4A shows enclosure assembly 100 from the top, or in the x-y plane. FIG. 4B shows a side view of enclosure assembly 100, in the y-z plane.

Referring again to FIG. 1 and FIG. 4A, enclosure halves 110A and 110B are offset along the x-y plane, which is defined by a surface of PWA 101. Particularly, in this embodiment, enclosure halves 110A and 110B are offset along the y-axis. Enclosure halves 110A and 110B are not offset, i.e. are substantially flush, along the x-axis.

Referring again to FIGS. 4A and 4B, the symmetrical configuration of enclosure halves 110A and 110B is shown. Enclosure assembly 100 is symmetrical about an axis residing in the plane defined by a surface of PWA 101. Preferably, this axis is centrally located on PWA 101. In the present embodiment, enclosure assembly 100 is symmetrical about axis 145, which is shown in FIG. 4A.

A method for assembling an enclosure for a printed wiring assembly is also provided. The method includes disposing first enclosure half 110A on one side of PWA 101, and disposing second enclosure half 110B on an opposed side of PWA 101. Enclosure halves 110A and 110B are disposed in an offset position, and the enclosure is preferably symmetrical about an axis in a plane defined by PWA 101. The method further includes securing enclosure halves 110A and 110B to PWA 101 with a connection system, such as one that includes holes 115 and female studs 120.

The enclosure according to the present invention has numerous advantages. The enclosure allows easy access to connectors without the need for designing enclosure components specific to the PWA, while providing a simple, stable mounting for the PWA. Also, connectors may be connected, disconnected and replaced without the need to remove either of the enclosure halves. A further advantage is the ability to hermetically seal the PWA electronics with the enclosure while allowing the use of ordinary PWA-mounted connectors. Another advantage is the ability to have connectors, controls and other PWA mounted components on either end of the assembly.

Another advantage is that, because there are no holes in the enclosure to accommodate connectors, the same enclosure design can be used for different PWA designs, and the same enclosure design can be used for different connector arrangements. Furthermore, because the enclosure components are preferably identical, and because they are suitable for use with a variety of PWAs, the enclosure system can be manufactured and assembled more simply and with lower cost.

It should be understood that various alternatives, combinations and modifications of the teachings described herein could be devised by those skilled in the art. The present invention is intended to embrace all such alternatives, modifications and variances that fall within the scope of the appended claims.

What is claimed is:

1. An enclosure for a printed wiring assembly, comprising:
    a first component disposed on a first side of said printed wiring assembly; and
    a second component disposed on a second side of said printed wiring assembly,
    wherein said first component is offset from said second component, and wherein at least a portion of a first surface of said printed wiring assembly is exposed to the atmosphere, and wherein at least a portion of a second opposite surface of said printed wiring assembly is exposed to the atmosphere.

2. The enclosure according to claim 1, wherein said first component and said second component are substantially identical in shape and size.

3. The enclosure according to claim 1, wherein said printed wiring assembly comprises a printed wiring board, and wherein the exposed portions of said first and second surfaces are opposite surfaces of said printed wiring board.

4. The enclosure according to claim 1, wherein said first component is offset from said second component along a plane defined by a surface of said printed wiring assembly.

5. The enclosure according to claim 1, wherein said first component and said second component define first and second enclosed regions on said first and second surfaces of said printed wiring assembly, respectively.

6. The enclosure according to claim 5, wherein at least one electronic component is disposed in at least one of said first and second enclosed regions of said printed wiring assembly.

7. The enclosure according to claim 5, wherein at least one connector is disposed in one of said first and second exposed portions of said printed wiring assembly.

8. The enclosure according to claim 5, wherein said enclosed regions are hermetically sealed.

9. The enclosure according to claim 1, wherein said first component and said second component are constructed from at least one material selected from the group consisting of: a metal and conductively coated plastic.

10. The enclosure according to claim 4, wherein said enclosure is symmetrical about an axis that is centrally located on said printed wiring board and in said plane defined by said printed wiring board.

11. The enclosure according to claim 1, wherein said first component and said second component are electrically connected to said printed wiring assembly.

12. The enclosure according to claim 1, further comprising a connection arrangement that fastens said first component and said second component to said printed wiring assembly.

13. The enclosure according to claim 12, wherein said connection arrangement comprises:
    a first set of holes and a first set of female studs on said first component; and
    a second set of holes and a second set of female studs on said second component: and
    a number of tensional fasteners to maintain said first component and said second component in a fixed offset position relative to said printed wiring assembly, and to maintain said enclosure as an integral whole,
    wherein said first set of holes is mated with said second set of female studs, and
    wherein said second set of holes is mated with said first set of female studs.

14. The enclosure according to claim 13, wherein said tensional fasteners are selected from the group consisting of rivets, screws, nuts and bolts, a chemical adhesive, a mechanical fastener, and any combination thereof.

15. The enclosure according to claim 12, wherein said connection arrangement comprises tension inducing devices that hold said first component and said second component in a fixed offset position relative to said printed wiring assembly, while maintaining said enclosure as an integral whole.

* * * * *